US012768040B2

(12) United States Patent
Anthis et al.

(10) Patent No.: US 12,768,040 B2
(45) Date of Patent: Oct. 20, 2026

(54) ATOMIC LAYER DEPOSITION OF RUTHENIUM OXIDE COATINGS

(71) Applicant: APPLIED MATERIALS, INC., Santa Clara, CA (US)

(72) Inventors: Jeffrey W. Anthis, Redwood City, CA (US); Nasrin Kazem, Santa Clara, CA (US); Lakmal Charidu Kalutarage, San Jose, CA (US); Jayden Stephen John Shackerley Potter, Menlo Park, CA (US); Thomas Joseph Knisley, Livonia, MI (US); Lisa Enman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 745 days.

(21) Appl. No.: 18/099,459

(22) Filed: Jan. 20, 2023

(65) Prior Publication Data

US 2024/0247370 A1 Jul. 25, 2024

(51) Int. Cl.

| | |
|---|---|
| ***C23C 16/455*** | (2006.01) |
| ***C23C 16/40*** | (2006.01) |
| ***H01B 1/08*** | (2006.01) |
| ***H10H 20/833*** | (2025.01) |
| ***H10P 14/40*** | (2026.01) |
| *H10H 20/01* | (2025.01) |
| *H10P 14/43* | (2026.01) |

(52) U.S. Cl.
CPC ...... *C23C 16/45553* (2013.01); *C23C 16/405* (2013.01); *C23C 16/45525* (2013.01); *C23C 16/45536* (2013.01); *H01B 1/08* (2013.01); *H10H 20/833* (2025.01); *H10P 14/418* (2026.01); *H10H 20/032* (2025.01); *H10P 14/432* (2026.01)

(58) Field of Classification Search
None
See application file for complete search history.

(56) References Cited

U.S. PATENT DOCUMENTS

| | | | | |
|---|---|---|---|---|
| 2008/0023059 A1* | 1/2008 | Basol | H10F 10/161 136/244 |
| 2009/0311500 A1* | 12/2009 | Ye | C23C 16/40 427/255.19 |
| 2011/0198756 A1* | 8/2011 | Thenappan | C07F 17/02 257/E21.294 |
| 2020/0318236 A1* | 10/2020 | Arkles | C23C 16/16 |

OTHER PUBLICATIONS

Yu et al. "Electronic structure of RuO". Journal of Quantitative Spectroscopy & Radiative Transfer. 288 (2022) 108247 (Year: 2022).*

* cited by examiner

*Primary Examiner* — Jose I Hernandez-Kenney
(74) *Attorney, Agent, or Firm* — Lowenstein Sandler LLP

(57) ABSTRACT

A method includes depositing a coating including stoichiometric one-to-one ruthenium oxide (RuO) onto a surface of a substrate. The coating is deposited by performing an atomic layer deposition (ALD) process using at least one precursor.

12 Claims, 6 Drawing Sheets

ATOMIC LAYER DEPOSITION OF RUTHENIUM OXIDE COATINGS

TECHNICAL FIELD

Embodiments of the present disclosure relate to a method for depositing a ruthenium oxide (RuO) coating on substrates using atomic layer deposition (ALD), an article having a RuO coating deposited by ALD, and a coating composition including RuO deposited on a substrate by ALD.

BACKGROUND

Ruthenium oxides are typically used as conducting oxides. However, known techniques for depositing ruthenium oxides all result in ruthenium dioxide ($RuO_2$).

SUMMARY

The following is a simplified summary of the disclosure in order to provide a basic understanding of some aspects of the disclosure. This summary is not an extensive overview of the disclosure. It is not intended to delineate any scope of the particular implementations of the disclosure or any scope of the claims. Its sole purpose is to present some concepts of the disclosure in a simplified form as a prelude to the more detailed description that is presented later.

In some embodiments, a method includes depositing a coating including stoichiometric one-to-one ruthenium oxide (RuO) onto a surface of a substrate. The coating is deposited by performing an atomic layer deposition (ALD) process using at least one precursor.

In some embodiments, an article includes a substrate and a coating on a surface of the substrate. The coating includes stoichiometric one-to-one RuO.

In some embodiments, a coating composition for a surface of a substrate includes stoichiometric one-to-one RuO.

BRIEF DESCRIPTION OF THE DRAWINGS

The present disclosure is illustrated by way of example, and not by way of limitation, in the figures of the accompanying drawings in which like references indicate similar elements. It should be noted that different references to “an” or “one” embodiment in this disclosure are not necessarily to the same embodiment, and such references mean at least one.

DETAILED DESCRIPTION

Figure 1:
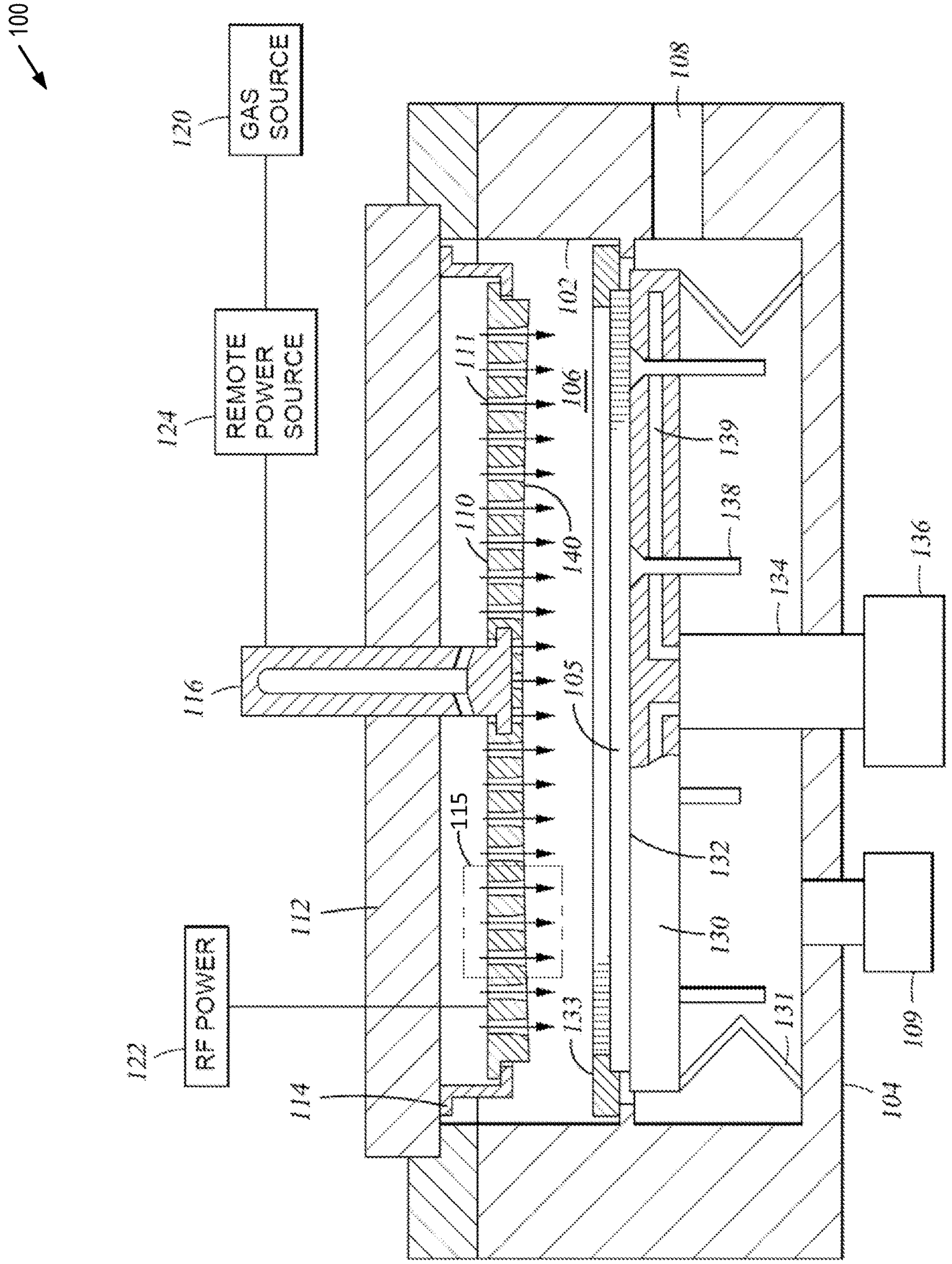
FIG. 1 is a cross-sectional view of an example deposition chamber system, according to some aspects of the present disclosure.

Embodiments of the present disclosure are directed to methods for atomic layer deposition of ruthenium oxide coatings. Articles having ruthenium oxide coatings deposited by atomic layer deposition are also described in the present disclosure. Specifically, ruthenium oxide coatings having a stoichiometric one-to-one (1:1) ratio of ruthenium and oxygen (e.g., RuO) are described herein along with methods for atomic layer deposition of such coatings.

Ruthenium oxides may be used as conducting oxides. Specifically, ruthenium oxides may be used as a contact material, such as for semiconductor devices or light-emitting diodes (LEDs), etc. Ruthenium oxides may also be used as coatings on electrodes and/or as catalysts. However, conventionally formed ruthenium oxides are ruthenium dioxide ($RuO_2$). Ruthenium dioxide is typically stable and is the most common oxide of ruthenium. Additionally, ruthenium dioxide can be prepared by chemical vapor deposition (CVD) processes.

Because of the instability of RuO, prior attempts at forming stoichiometric one-to-one RuO coatings have been unsuccessful. When attempting to synthesize RuO using conventional methods, for example, the oxide material is fully consumed, resulting in final coating of Ru metal. However, unexpectedly, when nitrogen dioxide ($NO_2$) is used as an oxidant and Ru as a reactant during ALD deposition, stoichiometric one-to-one RuO is formed. The ALD process(es) described herein create a conformal coating of RuO on the surface of a substrate. The coating can be deposited by forming multiple layers that are built up over multiple ALD cycles.

In some embodiments, a substrate is placed into an ALD process chamber. The chamber may be purged with an inert gas (e.g., argon, carbon dioxide, helium, nitrogen, etc.). In some embodiments, an oxidizing gas (such as $NO_2$, $N_2O$, $CO_2$, and/or CO) is pulsed (e.g., introduced) into the process chamber and reacts with the surface of the substrate. In some embodiments, the oxidizing gas is then purged from the process chamber (e.g., by pumping down the process chamber, flowing an inert gas into the process chamber, etc.). In some embodiments, a ruthenium-containing precursor is pulsed into the process chamber to react with the surface of the substrate. The process chamber may then again be purged (e.g., with inert gas) to purge the ruthenium-containing precursor from the chamber. The purging and pulsing operations can be repeated multiple times to achieve a combined target coating thickness of RuO.

Embodiments of the present disclosure provide advantages over conventional methods and coatings described above. Particularly, RuO deposited via the ALD process(es) described herein has increased conductive properties over $RuO_2$ that is conventionally used due to the lower concentration of oxygen. Because RuO is more ruthenium-rich compared to $RuO_2$, RuO is a more effective conductor. Additionally, RuO deposited by ALD as described herein can be a conformal coating on complex substrate geometries. Moreover, in some embodiments, RuO deposited by ALD is transparent (e.g., substantially transparent), allowing RuO to be used in applications where a transparent conductor is useful, such as transparent heating elements on glass substrates and/or as a transparent contact (e.g., a transparent electrode) on micro LEDs. RuO also has the advantage of being relatively simple to deposit by ALD. For example, in some embodiments, a single ruthenium-containing precursor can be used to grow a RuO film layer on a substrate, in contrast to the multiple metal precursors used in some conventional ALD processes. Therefore, the methods of the present disclosure can provide increased substrate manufacturing efficiency.

FIG. 1 is a cross-sectional view of an example deposition chamber system 100, according to some aspects of the present disclosure. In this illustrative embodiment, the system 100 is an ALD system. However, the system 100 is just an exemplary system that may be used to deposit coating(s) on a substrate, and it contemplated that other deposition chambers may be utilized in accordance with the embodiments described herein. In some embodiments, the system 100 can be used to deposit a RuO coating on a substrate. The RuO coating may be grown or deposited using ALD on various substrates including silicon-based substrates, carbon-based substrates, metal-based substrates, and/or dielectric substrates. In some examples, the substrate may be made up of one of $SiO_2$, Si, TiN, Ru, GaN, a dieletric material, or a carbon-based material, and so on.

The chamber system 100 generally includes walls 102, a bottom 104, and a gas distribution plate or diffuser 110, and substrate support 130 which define a process volume 206. The process volume 106 is accessed through a sealable slit valve 108 formed through the walls 102 such that the substrate, may be transferred in and out of the chamber system 100. The substrate support 130 includes a substrate receiving surface 132 for supporting a substrate 105 and stem 134 coupled to a lift system 136 to raise and lower the substrate support 130. A reactor frame 133 (e.g., mask frame or shadow frame) may be placed over periphery of the substrate 105 during processing. Lift pins 138 are moveably disposed through the substrate support 130 to move the substrate 105 to and from the substrate receiving surface 132 to facilitate substrate transfer. The substrate support 130 may also include heating and/or cooling elements 139 to maintain the substrate support 130 and substrate 105 positioned thereon at a desired temperature. The substrate support 130 may also include grounding straps 131 to provide RF grounding at the periphery of the substrate support 130.

The diffuser 110 is coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 is coupled to the backing plate 112 to provide gas through the backing plate 112 to a plurality of opening structures 111 corresponding to gas passages formed in the diffuser 110 and to the substrate receiving surface 132. A vacuum pump 109 is coupled to the chamber system 100 to control the pressure within the process volume 106. An RF power source 122 is coupled to the backing plate 112 and/or to the diffuser 110 to provide RF power to the diffuser 110 to generate an electric field between the diffuser 110 and the substrate support 130 so that a plasma may be formed from the gases present between the diffuser 110 and the substrate support 130. Various RF frequencies may be used, such as a frequency between about 0.3 MHz and about 200 MHz.

A remote power source 124, such as an inductively coupled remote plasma source, may also be coupled between the gas source 126 and the backing plate 112. Between processing substrates, a cleaning gas may be provided to the remote power source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases include but are not limited to $NF_3$, $F_2$, and $SF_6$.

In one embodiment, the heating and/or cooling elements 139 may be utilized to maintain the temperature of the substrate support 130 and substrate 105 thereon during deposition less than about 400 degrees Celsius or less. In one embodiment, the heating and/or cooling elements 139 may be used to control the substrate temperature to less than 100 degrees Celsius, such as between 20 degrees Celsius and about 90 degrees Celsius.

The spacing during deposition between a top surface of the substrate 105 disposed on the substrate receiving surface 132 and a bottom surface 140 of the diffuser 110 may be between 400 mil and about 1,200 mil, for example between 400 mil and about 800 mil. In one embodiment, the bottom surface 140 of the diffuser 110 may include a concave curvature wherein the center region is thinner than a peripheral region thereof, as shown in FIG. 1.

Figure 2:
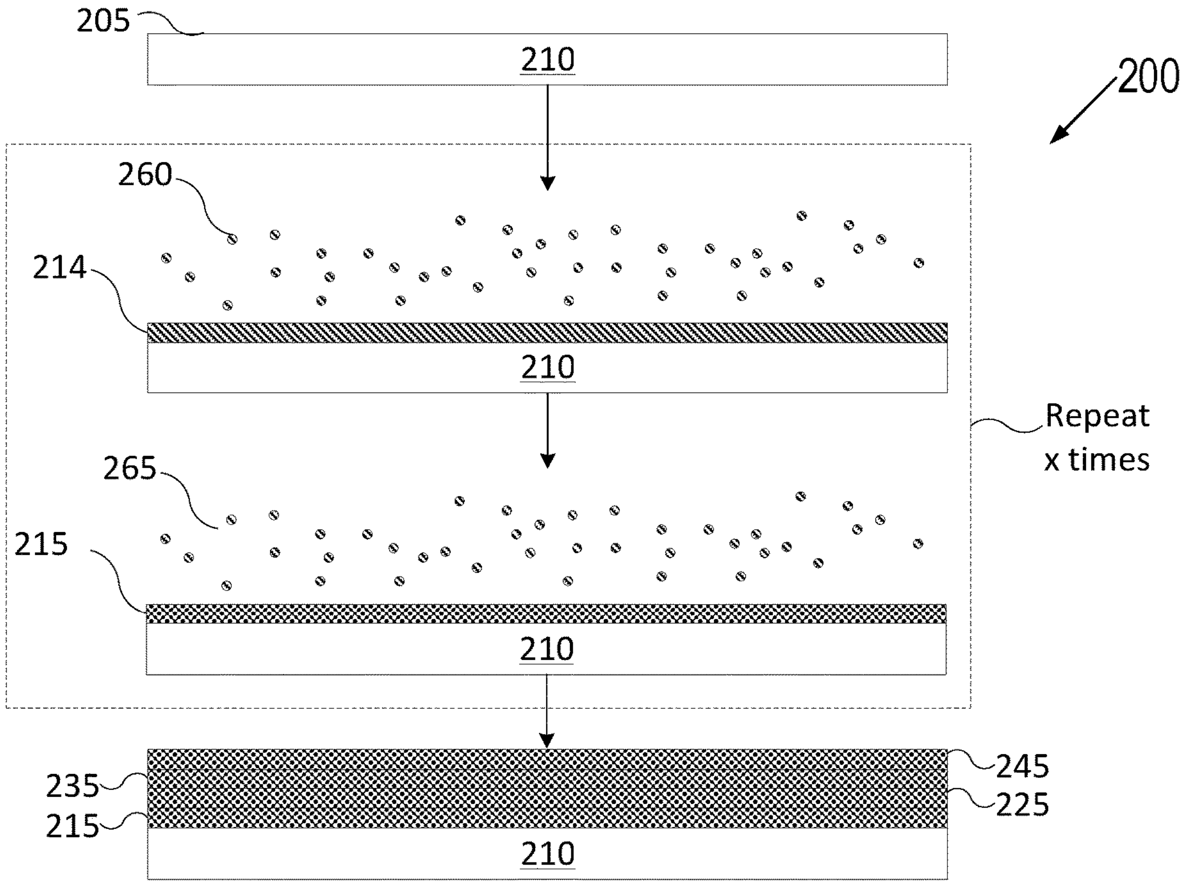
FIG. 2 depicts a RuO deposition process in accordance with a variety of Atomic Layer Deposition techniques, according to some aspects of the present disclosure.

FIG. 2 depicts a RuO deposition process in accordance with a variety of ALD techniques according to some aspects of the present disclosure. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to sequential alternating pulses of gaseous chemical precursors that chemically react with the surface one at a time in a self-limiting manner.

Referring to FIG. 2, an article 210 has a surface 205. Article 210 may represent various substrates and/or substrate types including but not limited to semiconductor wafers, LEDs (e.g., micro LEDs), glass wafers, and so on. The article 210 and surface 205 may be made from a metal (such as aluminum, stainless steel, titanium, copper, etc.), a ceramic, a metal-ceramic composite, a polymer, a polymer ceramic composite, a carbon-based material, a dielectric material, or other suitable materials, and may further comprise materials such as AlN, Si, SiC, $Al_2O_3$, $SiO_2$, TiN, Ru, GaN, and so on. In some embodiments, the substrate is a low-k dielectric material. A low-k dielectric material may have a small relative dielectric constant relative to $SiO_2$.

Each individual chemical reaction between a precursor and the surface is known as a "half-reaction." During each half reaction, a precursor or reactant is pulsed onto the surface for a period of time sufficient to allow the precursor or reactant to fully react with the surface. The reaction is self-limiting as the precursor/reactant will only react with a finite number of available reactive sites on the surface, forming a uniform continuous adsorption layer on the surface. Any sites that have already reacted with a precursor/reactant will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

As illustrated in FIG. 2, article 210 having surface 205 may be introduced to a first precursor 260 for a first duration until a first half reaction of the first precursor 260 with surface 205 partially forms layer 215 by forming an adsorption layer 214. Subsequently, article 210 may be introduced to a second precursor 265 (also referred to as a reactant) to cause a second half reaction to react with the adsorption layer 214 and fully form the layer 215. The first precursor 260 may be an oxygen precursor. In some examples, the first precursor 260 includes $NO_2$, $N_2O$, $CO_2$, and/or CO.

The second precursor 265 may be a precursor for ruthenium, for example. In some embodiments, the first precursor 260 includes a ruthenium-containing compound having ruthenium bonded to various diene groups and/or arene groups. In some examples, the first precursor 260 includes one or more compounds having the form of (diene)Ru$(CO)_3$ or (arene)Ru(diene). In further examples, the first precursor 260 includes Ru(II)Cp2Ru, (MeCp)2Ru, or (EtCp)2Ru. Layer 215 may be uniform, continuous, and conformal. The article 210 may alternately be exposed to the first precursor 260 and second precursor 265 up to x number of times to achieve a target thickness for the layer 215. X may be an integer from 1 to 100, for example. In some examples, X is approximately 30. A result of the sequence of repeated half reactions may be to grow additional layers 225, 235, and 245. The number and thickness of the layers may be selected based on the targeted coating thickness and properties. The various layers may remain intact or in some embodiments may be interdiffused.

The surface reactions (e.g., half-reactions) are done sequentially. Prior to introduction of a new precursor, the chamber in which the ALD process takes place may be purged with an inert carrier gas (such as nitrogen or air) to remove any unreacted precursor and/or surface-precursor reaction byproducts. At least one precursor is used. In some embodiments, more than one precursor may be used to grow film layers having the same composition (e.g., to grow multiple layers of RuO on top of each other). In some embodiments, different precursors may be used to grow different film layers having different compositions.

ALD processes may be conducted at various temperatures depending on the type of ALD process. The optimal temperature range for a particular ALD process is referred to as the "ALD temperature window." Temperatures below the ALD temperature window may result in poor growth rates and/or non-ALD type deposition. Temperatures above the ALD temperature window may result in thermal decomposition of the article and/or rapid desorption of the precursor. The ALD temperature window for depositing RuO may range from about 20° C. to about 400° C. In some embodiments, the ALD temperature window is between about 150° C. and 350° C. In some embodiments, the ALD temperature window is between about 200° ° C. and 210° C.

ALD processes may be conducted at various pressures depending on the type of ALD process. The optimal pressure range for a particular ALD process is referred to as the "ALD pressure window." The ALD pressure window for depositing RuO may range from about 2 Torr to about 8 Torr. In some embodiments, the ALD pressure window is between about 3 Torr and 7 Torr. In some embodiments, the ALD pressure window is between about 4 Torr and 6 Torr.

The ALD process allows for conformal film layers having uniform film thickness on articles and surfaces having complex geometric shapes and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets).

With the ALD technique, RuO films can be grown, for example, by proper sequencing of the precursors used to grow RuO, as illustrated in more detail in the examples below.

Figure 3A:
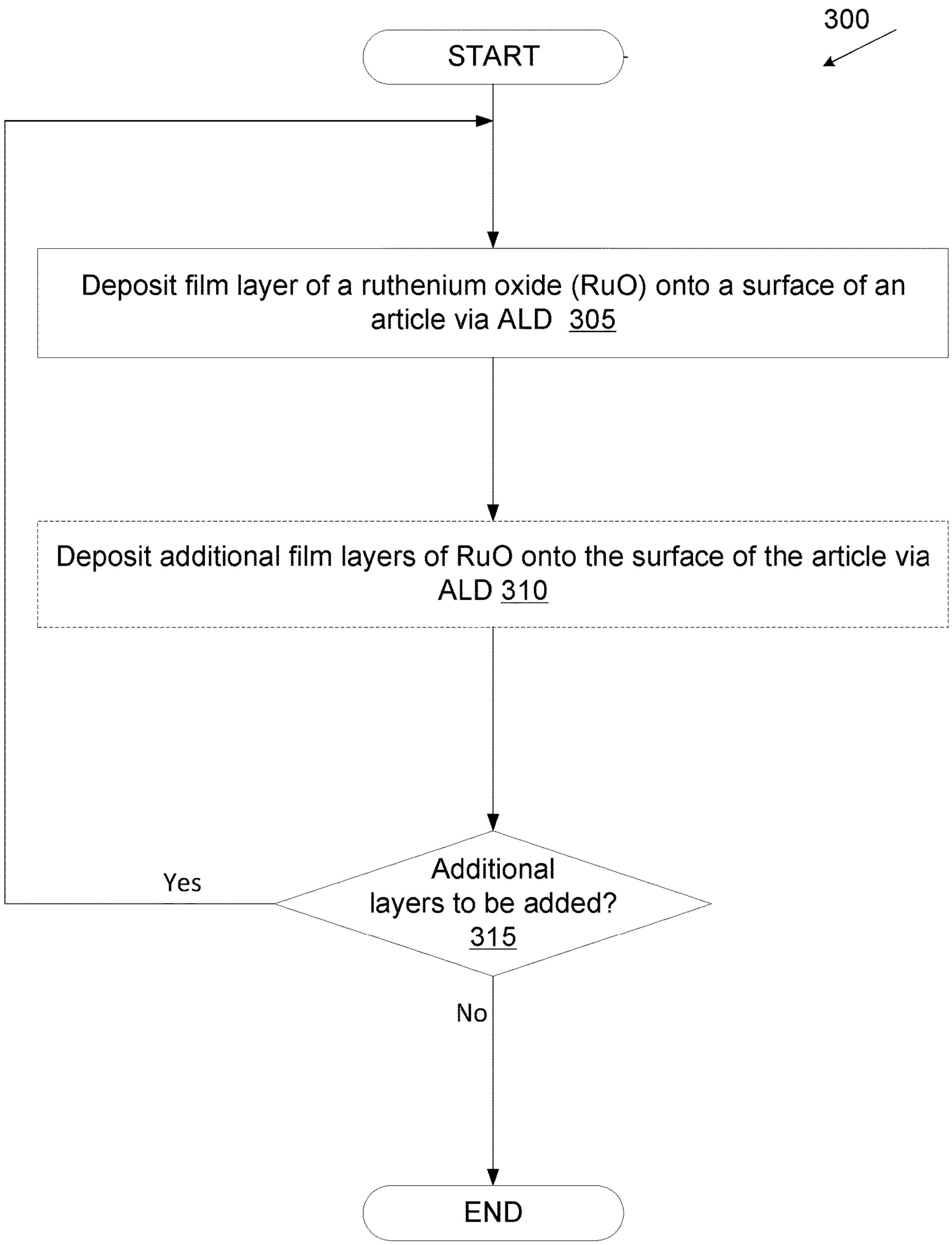
FIG. 3A illustrates a method for forming a RuO coating on a substrate, according to some aspects of the present disclosure.

FIG. 3A illustrates a method 300 for forming a RuO coating on a substrate (e.g., an article) according to some aspects of the present disclosure. Optionally, the method 300 begins by masking one or more portions of the substrate. The masked portions of the substrate are portions not to receive a RuO coating, while the unmasked portions are to receive the RuO coating. Pursuant to block 305, the method includes depositing a first film layer of ruthenium oxide onto a surface of an article (e.g., the substrate). The first film layer is grown from at least one precursor using an ALD process. Pursuant to block 310, the method optionally includes depositing one or more second film layers of ruthenium oxide onto the surface of the article. The one or more second film layers are grown from the at least one precursor using the ALD process.

In some embodiments, when the first film layer comprises stoichiometric one-to-one ruthenium oxide (RuO). The layer may be formed by the following process sequence:

1) Reaction of a first precursor with the substrate surface. The first precursor may include $NO_2$, $N_2O$, $CO_2$, and/or CO.
2) Purging of non-reacted precursor from the ALD process chamber.
3) Reaction of a second precursor with the surface. The second precursor may include a compound having the form of (diene)Ru$(CO)_3$, (arene)Ru(diene), Ru(II) Cp2Ru, (MeCp)2Ru, or (EtCp)2Ru. In some examples, the precursor includes (1,3-cyclohexadiene)Ru(CO)3 or (p-cymene)Ru(1,3 cyclohexadiene).
4) Purging of the second non-reacted precursor from the ALD process chamber.

The precursors listed above or any other suitable precursors may be used each time a RuO layer is grown using ALD, regardless of whether it is the first, second, or Nth layer, where the Nth layer would represent the finite number of layers grown on the surface of the substrate and selected based on targeted coating thickness and/or target coating properties.

In some embodiments, pursuant to block 315, the method may further include determining whether additional layers are to be added. Determining whether additional layers and/or how many layers are to be added can be either done in-situ, or prior to initiating the depositions (e.g., in the optional multi-component composition selection process). If additional layers are to be added, blocks 305 and 310 may be repeated. If no additional layers are to be added, the method ends, forming a RuO coating comprising all film layers deposited onto the surface of the article.

Figure 3B:
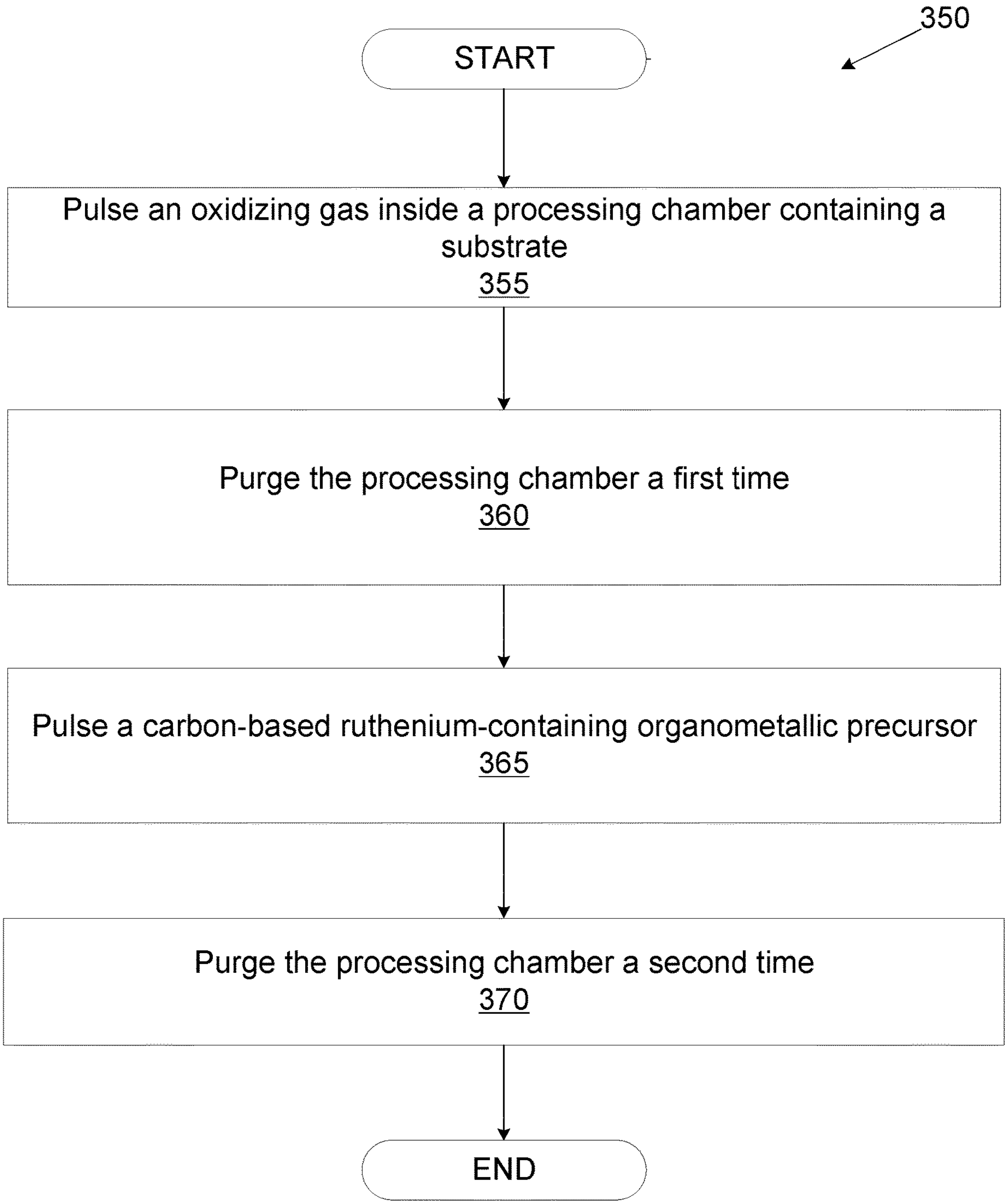
FIG. 3B illustrates a method for depositing a RuO film layer on a substrate, according to some aspects of the present disclosure.

FIG. 3B illustrates a method 350 for depositing a RuO film layer on a substrate according to some aspects of the present disclosure. In some embodiments, the method 350 represents a repeatable ALD deposition cycle. Optionally, the method 350 begins by purging a processing chamber with an inert gas (e.g., argon, carbon dioxide, helium, nitrogen, etc.). Pursuant to block 355, the method includes pulsing an oxidizing gas inside a processing chamber. A substrate to receive a RuO coating on a substrate surface by ALD is disposed within the processing chamber. The oxidizing gas may be pulsed onto the surface of the substrate. In some embodiments, the oxidizing gas includes $NO_2$ gas, $N_2O$ gas, $CO_2$ gas, and/or CO gas. In some embodiments, the oxidizing gas is pulsed into the processing chamber for a first duration. In some examples, oxidizing gas may be pulsed in the processing chamber for approximately two to 10 seconds. In further examples, oxidizing gas may be pulsed in the processing chamber for approximately four to eight seconds.

Pursuant to block 360, the method includes purging the processing chamber a first time. In some embodiments, a pump (e.g., pump system 128 of FIG. 1) removes the oxidizing gas from the processing chamber via an exhaust port. In some embodiments, the processing chamber is purged with an inert gas. The first purging at block 360 may have a second duration. The second duration may be longer than the first duration. In some examples, the processing chamber is purged for approximately five to 15 seconds to remove the oxidizing gas from the processing chamber. In further examples, the processing chamber is purged for approximately eight to 12 seconds.

Pursuant to block 365, the method includes pulsing a carbon-based ruthenium-containing organometallic precursor in the processing chamber. The precursor may be pulsed onto the surface of the substrate. In some embodiments, the precursor includes a compound having one or more diene and/or arene groups bonded to Ru. For example, the precursor may have the form of (diene)Ru$(CO)_3$ or (arene)Ru (diene). In some examples, the precursor includes (1,3-cyclohexadiene)Ru$(CO)_3$ and/or (p-cymene)Ru(1,3 cyclohexadiene). In some embodiments, the precursor is charged. For example, the precursor can include one or more of Ru(II) Cp2Ru or (MeCp)2Ru, (EtCp)2Ru. In some embodiments, the precursor is pulsed in the processing chamber for a third duration. The third duration may be shorter than the first duration. In some examples, the ruthenium-containing precursor is pulsed in the processing chamber for approximately two to six seconds. In further examples, the precursor is pulsed for approximately three to five seconds.

Pursuant to block 370, the method includes purging the processing chamber a second time. In some embodiments, the pump removes the precursor from the processing chamber via the exhaust port. In some embodiments, the processing chamber is purged the second time with an inert gas. The inert gas of the second purge may be the same gas or a different gas as the inert gas used to purge the processing chamber the first time at block 360. The inert gas may carry away un-reacted precursor in the processing chamber. The second purging at block 370 may have a fourth duration. The fourth duration may be shorter than the third duration. In some examples, the processing chamber is purged for approximately one to four seconds. In further examples, the processing chamber is purged for approximately one to three seconds.

The method 350 can be repeated as necessary to build up multiple layers of a RuO coating on the surface of the substrate. In some embodiments, the method 350 is repeated between 20 and 40 times to form a RuO coating on a substrate. In some embodiments, the method 350 is repeated between 25 and 35 times. Each performance of the method 350 may produce a RuO film layer having a thickness between approximately 1.0 and 2.5 Angstroms (e.g., the growth per cycle (GPC) of the ALD process described with respect to method 350 may be between approximately 1.0 and 2.5 Angstroms). In some examples, a single performance of the method 350 produces a RuO film layer that is between approximately 1.5 and 2.0 Angstroms thick (e.g., the GPC is between approximately 1.5 and 2.0 Angstroms).

The method 350 can be repeated to achieve a target RuO coating thickness on the surface of the substrate. In some embodiments, the method 350 is repeated to achieve a target RuO coating thickness on the surface of the substrate that is between approximately 25 Angstroms and 100 Angstroms thick. In some embodiments, the target RuO coating thickness is between approximately 45 Angstroms and 60 Angstroms thick. In examples where the substrate is a Si substrate, the target RuO coating thickness may be between approximately 50 Angstroms and 60 Angstroms, particularly between approximately 50 Angstroms and 55 Angstroms. In examples where the substrate is a $SiO_2$ substrate, the target RuO coating thickness may be between approximately 40 Angstroms and 60 Angstroms, particularly between approximately 45 Angstroms and 50 Angstroms.

Figure 4:
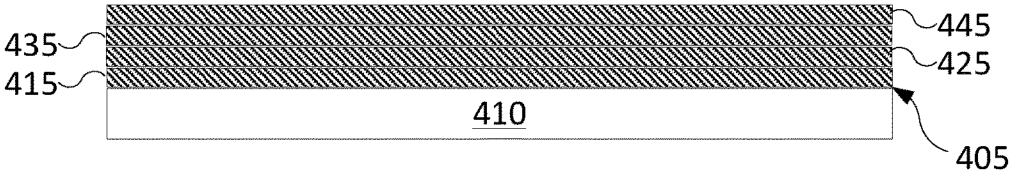
FIG. 4 depicts a variation of a RuO coating composition, according to some aspects of the present disclosure.

FIG. 4 depicts a variation of a RuO coating composition according to some aspects of the present disclosure. FIG. 4 illustrates a RuO coating composition for a surface 405 of an article 410 according to an embodiment. Surface 405 may be the surface of various articles 410. For example, articles 410 may include various substrates (e.g., silicon substrates, glass substrates, etc.). The article 410 may be made from a metal (such as aluminum, stainless steel, copper, etc.), a ceramic, a metal-ceramic composite, a polymer, a polymer ceramic composite, a dielectric material, a carbon-based material, a silicon-based material, or other suitable materials. In some examples, the article 410 is made up of materials such as $SiO_2$, Si, TiN, Ru, GaN, and so on.

In some embodiments, the RuO coating composition includes at least one first RuO film layer 415 coated onto surface 405 of article 410 using an ALD process. In some embodiments, the RuO coating composition includes one or more second RuO film layers 425, 435, 445 coated onto surface 405 of article 410 using an ALD process. The one or more second film layers may be coated over the top of the first film layer.

FIG. 4 illustrates an embodiment where the RuO coating composition includes a stack of RuO film layers on the surface 405, where the RuO film layers are intact and not interdiffused, and where all layers are of equal uniform thickness. In some embodiments, the layers may not have equal uniform thicknesses. The RuO film layers may be deposited (e.g., one on top of the other) to achieve a combined target coating thickness.

Figure 5:
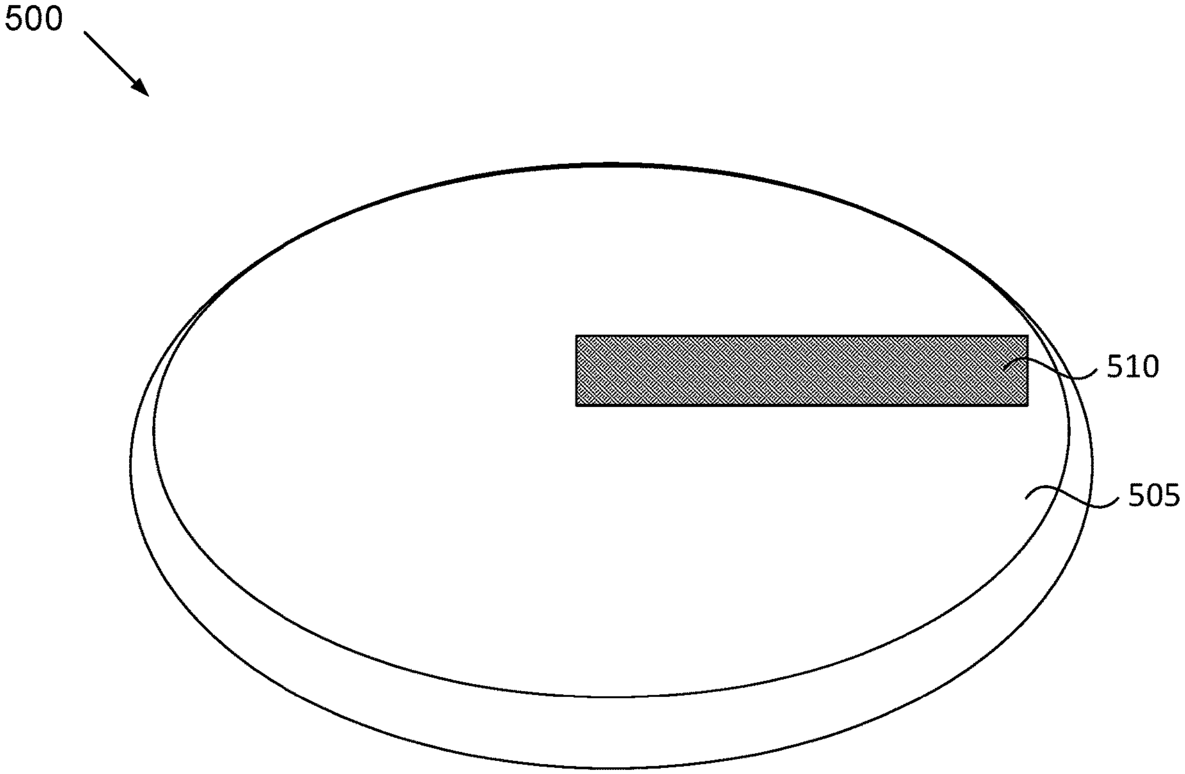
FIG. 5 illustrates a perspective view of a substrate, according to some aspects of the present disclosure.

FIG. 5 illustrates a perspective view of a substrate 500 according to some aspects of the present disclosure. The substrate 500, as depicted here, may include a surface with complex geometry and holes that are not illustrated. The complex geometry of surface 505 is configured to receive a RuO coating. Surface 505 of substrate 500 may include features such as mesas, trenches, vias, etc. Multiple features may be included on surface 505 depending on the type and/or purpose of manufactured substrate 500. In some embodiments, the surface 505 is a smooth and/or flat surface.

In some embodiments, a portion 510 of the surface 505 may be coated with an RuO coating by an ALD process as described herein. In some embodiments, the portion 510 having the RuO coating forms a transparent electrode on the surface 505 of the substrate. The RuO coating is grown on surface 505 using the ALD technique which enables a conformal coating of relatively uniform thickness on the surface despite the complex geometry of the features included on the surface 505 (not illustrated). In some examples, the RuO coating on a portion 510 of the surface 505 conforms to the surface geometry to form a conformal electrically conductive oxide coating. In some embodiments, the RuO coating is grown on surface 505 to form a conducting oxide layer (e.g., an electrode layer, etc.). In some embodiment, the RuO coating is grown on a copper interconnect to form a conducting oxide layer. In some embodiments, the RuO coating layer deposited with ALD maintains the relative shape and/or geometric configuration of the surface 505 so as to not disturb the functionality of the substrate 500. In some embodiments, prior to the ALD process, the surface 505 is masked leaving the portion 510 exposed to receive the RuO coating.

In some embodiments, the RuO coating may have a resistivity of between approximately 150 μOhm/cm (micro Ohms per centimeter) and 2,300 μOhm/cm. In some examples, where the substrate 500 is a silicon (Si) substrate, the RuO coating may have a resistivity between approximately 150 μOhm/cm and 230 μOhm/cm. In some examples, for a Si substrate, the RuO coating may have a resistivity between approximately 180 μOhm/cm and 200 μOhm/cm. In examples where the substrate 500 is a silicon dioxide ($SiO_2$) substrate, the RuO coating may have a resistivity between approximately 1,800 Ohm/cm and 2,300 Ohm/cm. In some examples, for a $SiO_2$ substrate, the RuO coating may have a resistivity between approximately 2,000 μOhm/cm and 2,100 μOhm/cm.

Figure 6:
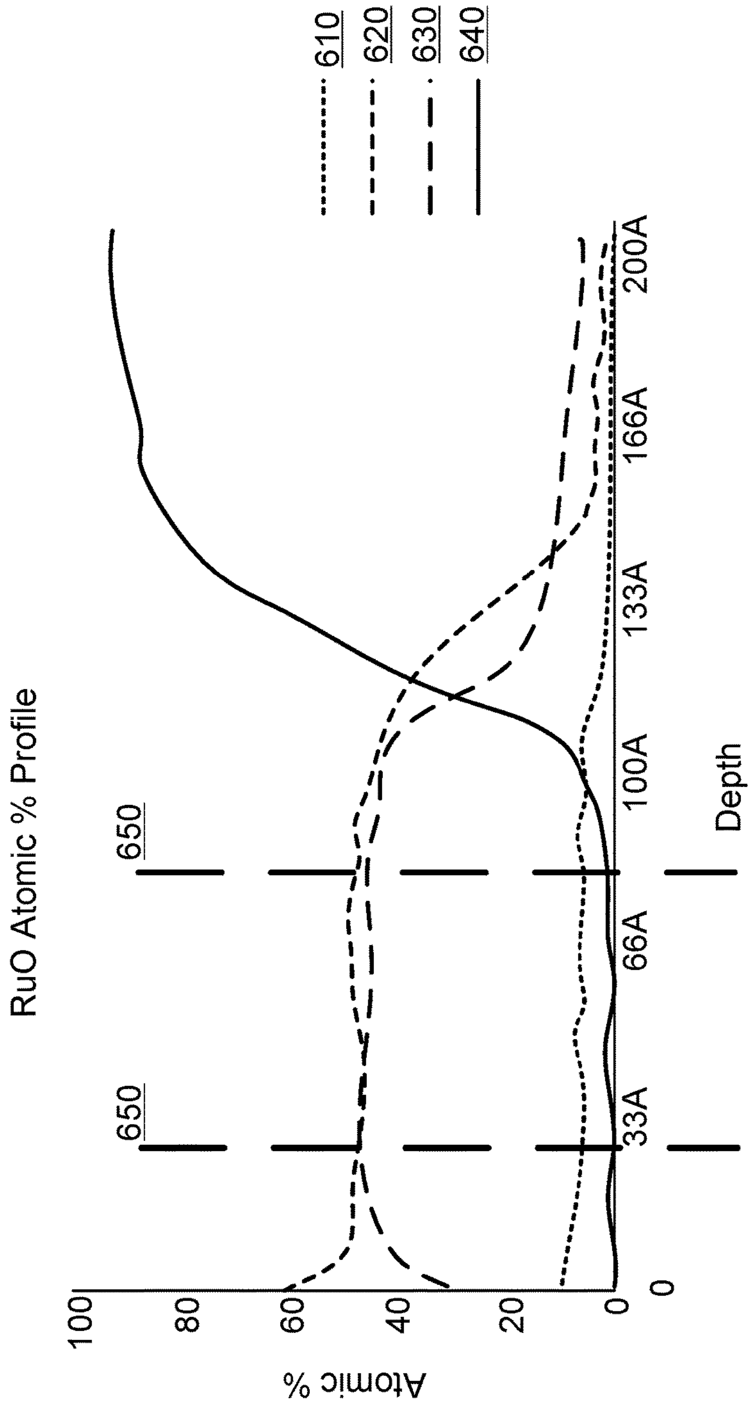
FIG. 6 illustrates an atomic percent profile a RuO coating, according to some aspects of the present disclosure.

FIG. 6 illustrates an atomic percent profile a RuO coating, according to some aspects of the present disclosure. Line 610 may represent the atomic % (e.g., atomic percent) of nitrogen in a RuO coating on a substrate. Line 620 may represent the atomic % of oxygen. Similarly, line 630 may represent the atomic % of ruthenium and line 640 may represent the atomic % of silicon. In some embodiments, the bulk of the RuO coating film is between a depth of 25 Angstroms and 80 Angstroms represented by vertical lines 650. In some embodiments, in the bulk of the RuO coating, the RuO coating includes between approximately 4 atomic % and 6 atomic % nitrogen, between approximately 45 atomic % and 50 atomic % oxygen, and between approximately 45 atomic % and 50 atomic % ruthenium. In some embodiments, in the bulk of the RuO coating, the RuO coating includes approximately 5.6 atomic % nitrogen, 47 atomic % oxygen, and approximately 47.4 atomic % ruthenium. In some embodiments, the RuO coating includes approximately equal atomic % of ruthenium and oxygen (e.g., the RuO coating has a stoichiometric 1:1 ratio). In some embodiments, trace amount of silicon are included in the RuO coating.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:

depositing a coating comprising stoichiometric one-to-one ruthenium oxide (RuO) onto a surface of a substrate, wherein the coating comprises an approximately equal ratio of ruthenium to oxygen, wherein the coating comprises between approximately 45 atomic percent and approximately 50 atomic percent oxygen and between approximately 45 atomic percent and approximately 50 atomic percent ruthenium, and wherein the coating is deposited by performing an atomic layer deposition (ALD) process using at least one precursor.

2. The method of claim 1, wherein the at least one precursor comprises a carbon-based ruthenium-containing organometallic precursor.

3. The method of claim 1, wherein the at least one precursor comprises one or more of (diene)$Ru(CO)_3$, (arene) Ru(diene), Ru(II)Cp2Ru, (MeCp)2Ru, or (EtCp)2Ru.

4. The method of claim 3, wherein the substrate comprises one or more of $SiO_2$, Si, TiN, Ru, GaN, or a carbon-based material.

5. The method of claim 1, wherein the substrate comprises one or more of a metal or a dielectric.

6. The method of claim 1, wherein depositing the coating comprises performing an ALD deposition cycle comprising:

pulsing an oxidizing gas into a processing chamber, wherein the substrate is disposed within the processing chamber;

purging the oxidizing gas from the processing chamber;

pulsing the at least one precursor into the processing chamber; and purging the at least one precursor from the processing chamber.

7. The method of claim 6, wherein the oxidizing gas comprises one or more of $NO_2$, $N_2O$, $CO_2$, or CO.

8. The method of claim 6, further comprising repeating the deposition cycle as plurality of times to achieve a target coating thickness.

9. The method of claim 8, wherein the target coating thickness is between approximately 25 Angstroms and 100 Angstroms.

10. The method of claim 1, wherein the coating is a conformal coating on the surface of the substrate.

11. The method of claim 1, wherein the coating is an electrically conductive oxide.

12. The method of claim 1, wherein the coating forms a substantially transparent electrode on the surface of the substrate.

* * * * *